(12) United States Patent
Tannous et al.

(10) Patent No.: US 6,196,001 B1
(45) Date of Patent: Mar. 6, 2001

(54) ENVIRONMENT CONTROLLED WIP CART

(75) Inventors: Adel G. Tannous, Santa Clara; Paul E. Lewis, San Jose, both of CA (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/417,257

(22) Filed: Oct. 12, 1999

(51) Int. Cl.$^7$ .................................................. F25B 21/02
(52) U.S. Cl. ........................ 62/3.61; 62/3.3; 62/371; 62/264; 62/246; 62/78; 62/3.7
(58) Field of Search ................................. 62/3.6, 3.3, 3.7, 62/371, 264, 246, 78

(56) References Cited

U.S. PATENT DOCUMENTS

| | | | |
|---|---|---|---|
| 3,982,584 | * 9/1976 | Spanoudis | 165/42 |
| 4,922,721 | 5/1990 | Robertson et al. | 62/237 |
| 5,331,840 | * 7/1994 | Williams | 73/19.1 |
| 5,415,012 | * 5/1995 | Maier-laxhuber et al. | 62/296 |
| 5,466,915 | * 11/1995 | Meier et al. | 219/622 |
| 5,910,210 | * 6/1999 | Violi et al. | 99/483 |

* cited by examiner

Primary Examiner—William Doerrler
Assistant Examiner—Mark Shulman
(74) Attorney, Agent, or Firm—Skjerven Morrill MacPherson LLP (57) ABSTRACT

A transportable cart assembly is described which controls various environmental conditions within an enclosure while transporting items such as semiconductor wafers or flat panel displays. A fan and filter unit is used to control the spread of small particles within the cart and a heating and cooling unit, such as a thermoelectric heater, is used to control the temperature within the enclosure. The fan and filter unit works in conjunction with the heating and cooling unit in a single-pass flow or recirculating cycle to maintain the temperatures within the enclosure at predetermined levels. The cart also has lighting and an ionization unit to control electrostatic discharge. The cart assembly is powered by an external power supply through a retractable power cord or through its on-board power supply. Also, the cart assembly can be specially configured to transport flat panel display cassettes by mounting a tilted platform within; this ensures that the flat panel display cassette remains securely seated within the tilted platform during transport. And to ensure the structural integrity of the cart assembly, a singular bracket is used to attach individual framing members of the cart together.

27 Claims, 9 Drawing Sheets

ENVIRONMENT CONTROLLED WIP CART

BACKGROUND

1. Field of the Invention

This invention relates to movable work-in-process (WIP) transports and more particularly to a WIP transport apparatus for moving materials requiring a temperature and humidity controlled environment.

2. Description of Related Art

Assemblies for carrying items currently exist for transporting materials from one area to another. Examples of such transport units are wheeled platforms with or without motor drives and wheeled shelves. Such units are used to transport a variety of materials including items extremely sensitive to the environment. Items such as disk drives, semiconductor wafers, and flat panel displays require clean environments and controlled temperature and humidity conditions at all times during their manufacture. Environmental control can become a problem in the manufacture of these materials, especially as they are transported between processing tools. During this transport, these materials may be exposed to contaminants such as particles or electrostatic charges as well as temperature and humidity variations. Exposure to uncontrolled environmental conditions can produce, for example, uneven deposition layers in semiconductors, induced thermal stresses, reduced yield, and an overall decrease in the quality of the final product.

To store materials, e.g., semiconductor wafers, in controlled environments between processing stages, specially designed storage containers are used as an intermediate storage. However, these containers are static and not easily transportable, thus requiring additional transport and exposure to the environment to and from these containers. Environment controlled transportation units currently exist to transport sensitive materials, e.g., motion picture films. See U.S. Pat. No. 4,922,721 (Robertson et al.), which is incorporated herein by reference. However, there is a need for a transport unit which controls a variety of environmental factors for transporting sensitive materials such as semiconductor wafers, disk drives, flat panel displays, and other electronic devices.

SUMMARY

In accordance with the invention, a transportable cart assembly is described which controls various environmental conditions within an enclosure while transporting items such as semiconductor wafers or flat panel displays. A fan and filter unit is used to control the spread of small particles within the cart, and the unit also circulates nitrogen pumped in from an external source or air within the enclosure to help control the temperature and humidity levels. The cart assembly also has a heating and cooling unit, which can be a thermoelectric heater such as a Peltier junction, to control the temperature within the enclosure. The use of Peltier junctions as the heating and cooling units offer the advantages of reduced power consumption, compact size, and flexibility of use.

The fan and filter unit works in conjunction with the heating and cooling unit in a single-pass flow or recirculating cycle; this aids in maintaining temperature levels within the enclosure at desired accuracy. The cart also has lighting and an ionization unit to control the electrostatic discharge on transported items and on the cart enclosure itself. The cart assembly is able to power its individual on-board units from an external power supply through a retractable power cord; or because of the transportable nature of the cart, power can be supplied through its on-board power supply while items are being transported.

Additionally, the cart assembly can be specially configured to transport flat panel displays during the fabrication process. This involves the attachment of a platform tilted at an angle while mounted within the cart enclosure. Having a tilted platform ensures that the flat panel display cassette remains securely seated within the platform during transport, offers ergonomic loading onto shelves, and ensures proper airflow between panels. Also, to ensure the structural integrity of the cart assembly, a singular bracket is used to hold the frame assembly of the cart together at the joints as well as to ease the assembly of the cart.

BRIEF DESCRIPTION OF THE DRAWINGS

Use of the same reference symbols in different figures indicates similar or identical items.

DETAILED DESCRIPTION

Figure 1A:
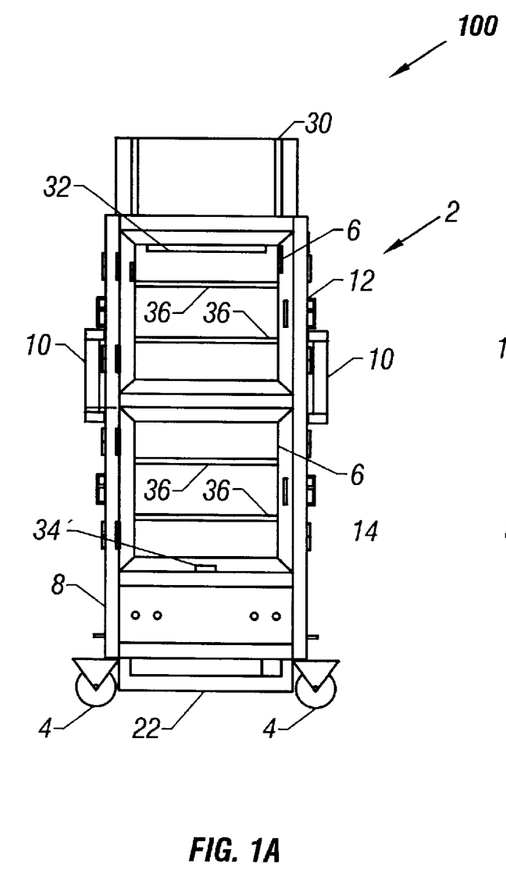
FIG. 1A shows a front view of the cart assembly.

FIG. 1A shows a front view of a work-in-process (WIP) cart assembly 100. Cart assembly 100 is built around a frame assembly 2 which, in one embodiment, can be made of members made of an extruded metal, e.g., anodized aluminum to form the structural frame. Such extrusions are commercially available from companies such as Bosch, Sodem, SKF, and Parker. Frame assembly 2 is supported by several wheels 4 which allow the easy transport of cart assembly 100 from one destination to another. Panels 6 are installed around frame assembly 2 to form an insulated enclosure assembly and these panels 6 can be made of a transparent material, e.g., polycarbonate in one embodiment, to allow an unobstructed view within the enclosure. Such polycarbonate panels are commercially available, e.g., Lexan produced by General Electric. To transport assembly 100, an operator can utilize one of several handles 10 located around frame assembly 2.

To allow secure transport of various materials and workpieces within cart assembly 100, several interchangeable platform members within the enclosure function as shelves 36. These shelves 36 can be made, in one embodiment, as simple wire racks to store a variety of items. In another embodiment, wire racks can be interchanged with specially fabricated shelves 36 to hold silicon wafers used in electron beam lithography applications, or shelves 36 designed to hold disk drives, or in an alternate embodiment, shelves 36 specially designed to hold flat panel displays. Additionally, shelves 36, in one embodiment, can be made to be electrically isolated from frame assembly 2 by having shelves 36 attach onto non-conductive mounting tabs (mounting tabs are not shown). This enables electrostatic sensitive workpieces to be electrically isolated from frame assembly 2. The description on different shelving configurations are given for illustrative purposes and are not meant to limit the scope of the different possible shelf configurations used within cart assembly 100.

Figure 1B:
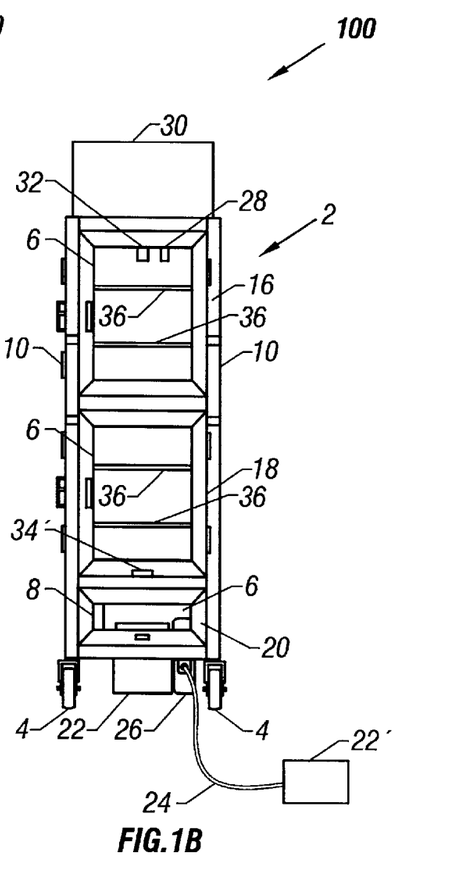
FIG. 1B shows a side view of the cart assembly of FIG. 1A.

To enable easy access to the interior of frame assembly 2 for storage and transport of workpieces, cart assembly 100 is built with several access panels. FIG. 1A shows a front view of an embodiment having front upper access panel 12 and front lower access panel 14. FIG. 1B shows a side view of the same embodiment of FIG. 1A having a side upper access panel 16 and a side lower access panel 18. Access panels 12, 14, 16 and 18 are designed to allow easy access to the interior of frame assembly 2 and can be made to open as an access door, as shown in FIGS. 1A and 1B. Also, to aid with accessibility of viewing, cart assembly 100 utilizes lighting units 28 which are mounted within the enclosure of cart assembly 100.

Because cart assembly 100 can be used to transport various workpieces which are highly sensitive to environmental factors such as temperature and humidity, cart assembly 100 can incorporate several different environmental controls. To control the spread of small particles and the circulation of gases, e.g., air or nitrogen, within frame assembly 2, a fan and filter unit (FFU) 30 is utilized. Such a FFU 30 is commercially available from the Atmostec company. Nitrogen may be pumped into the enclosure from an external source (external source is not shown). FFU 30 is mounted outside of the enclosure and atop frame assembly 2 in one embodiment or below in another embodiment. Mounted outside of the enclosure, FFU 30 can filter outside ambient air of particles and circulate the air within cart assembly 100. It can also aid in circulating gases within cart assembly 100, e.g., for a nitrogen gas purge, for protection of workpieces which are sensitive to air and humidity exposure during processing.

Figure 3A:
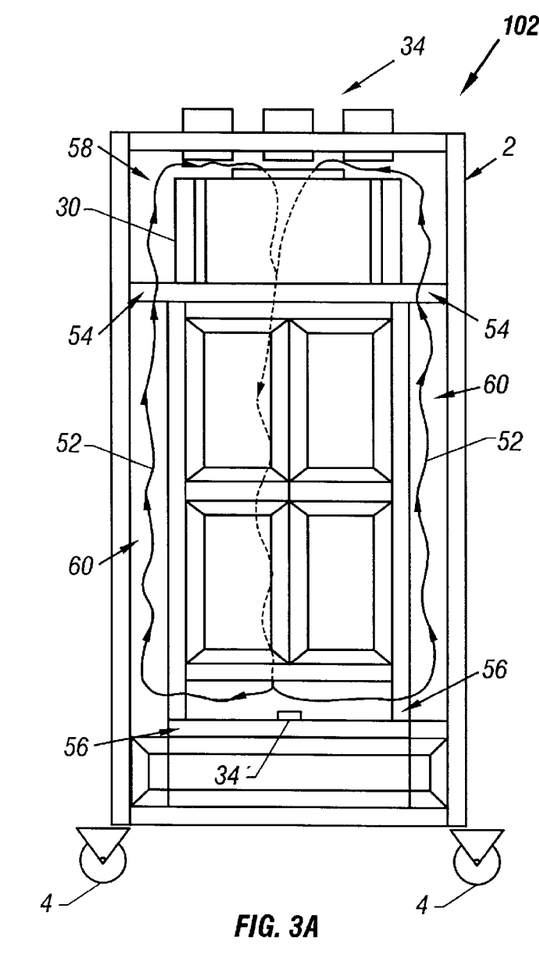
FIG. 3A shows a front view of the cart assembly with the fan and filter unit and the heating and cooling unit.

To control the temperature within cart assembly 100, a heating and cooling unit (HCU) 34 is utilized. A commercially available HCU 34 can be purchased from the Mencor company. HCU 34 can be mounted externally atop frame assembly 2 and adjacent to FFU 30. FIG. 3A shows the front view of cart assembly 102 with both FFU 30 and HCU 34. Even though HCU 34 can be mounted externally of frame assembly 2, it remains in thermal contact with the interior of frame assembly 2. HCU 34 in one embodiment is a thermoelectric heating unit, e.g., a Peltier junction unit. Peltier junctions are well known in the art and operate by the application of a voltage to an assembly of dissimilar metals. Application of voltage to the junction in one direction heats a side of the junction and cools the opposite side, while reversing the voltage application likewise reverses the heating and cooling effect of the junction. This effect can be utilized by a single or several heating and cooling units mounted adjacent to each other as shown in FIG. 3A, to either heat or cool the air to a predetermined temperature. The use of Peltier junctions as HCU 34 offers several advantages including reduced power consumption, compact size, and flexibility in use and application. To control the temperature and humidity levels within cart assemblies 100, 102, a conventional temperature and humidity sensor 34' is located within the bottom of the enclosure within the cart. Sensor 34' is connected to a closed-loop feedback controller to maintain the temperature and humidity levels.

Figure 3B:
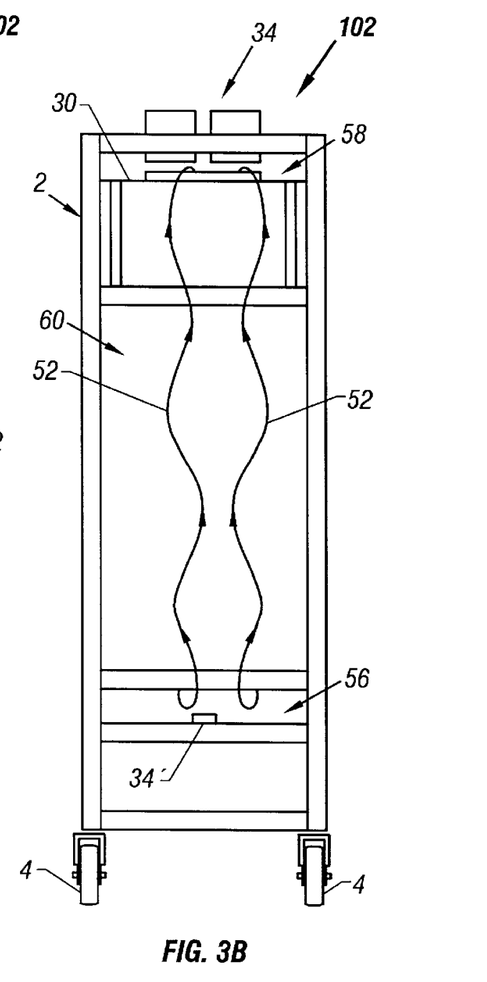
FIG. 3B shows a side view of the cart assembly with the fan and filter unit and the heating and cooling unit taken from FIG. 3A.

The direction of airflow 52, which is compelled by FFU 30 within cart assembly 102, is shown in FIGS. 3A and 3B. FIG. 3B is a side view of cart assembly 102 showing FFU 30 and HCU 34 disposed atop frame assembly 2. As the air 52 first enters chamber 58 through entrance duct 54, which is defined by frame assembly 2, it passes by HCU 34 and undergoes a heat exchange. Airflow 52 is either heated or cooled to a predetermined temperature; it then passes through FFU 30 and then through the enclosure, and finally through exit duct 56 to be recirculated through return chambers 60 and back past HCU 34 and again through FFU 30. With this embodiment, as shown in FIGS. 3A and 3B, a recirculating flow is established within cart assembly 102 to help maintain the internal temperature at regulated levels.

In addition to temperature and humidity control, cart assembly 100 also utilizes an ionization unit 32 to control electrostatic discharge (ESD) and particle attraction within cart assembly 100. Conventional ion bars (available through the company, Ion Systems) can be used as ionization unit 32, which is mounted within the enclosure of frame assembly 2. Ionization unit 32 operates by producing charged ions in order to discharge surfaces and workpieces within cart assembly 100 and also prevents charges from building within the enclosure.

A power supply 22 is mounted externally below frame assembly 2 in one embodiment. Power supply 22 can be configured, as shown in FIGS. 1A and 1B, to provide power to each individual unit on cart assembly 100 by cables and power lines routed throughout frame assembly 2. The individual units of cart assembly 100 may be powered in different ways. In one embodiment, power supply 22 is a conventional universal power supply (UPS) or a chargable battery. Such a UPS can be commercially obtained from the American Power Conversion company. This UPS could be charged by voltage supplied from an independent voltage supply 22' (independent voltage supply 22' can be a conventional 110V power supply) through a retractable power cord 24, which is housed in cord reel 26, as shown in FIG. 1B. Once power supply 22 is fully charged, power cord 24 can be detached from independent voltage supply 22' and retracted to allow the free transport of cart assembly 100 while power supply 22 supplies the necessary voltage. Alternatively, power can be supplied directly from the independent voltage supply through power supply 22 and then to the individual units. Access to power supply 22 and cord reel 26 can be enabled by a power supply access panel 20.

Figure 2:
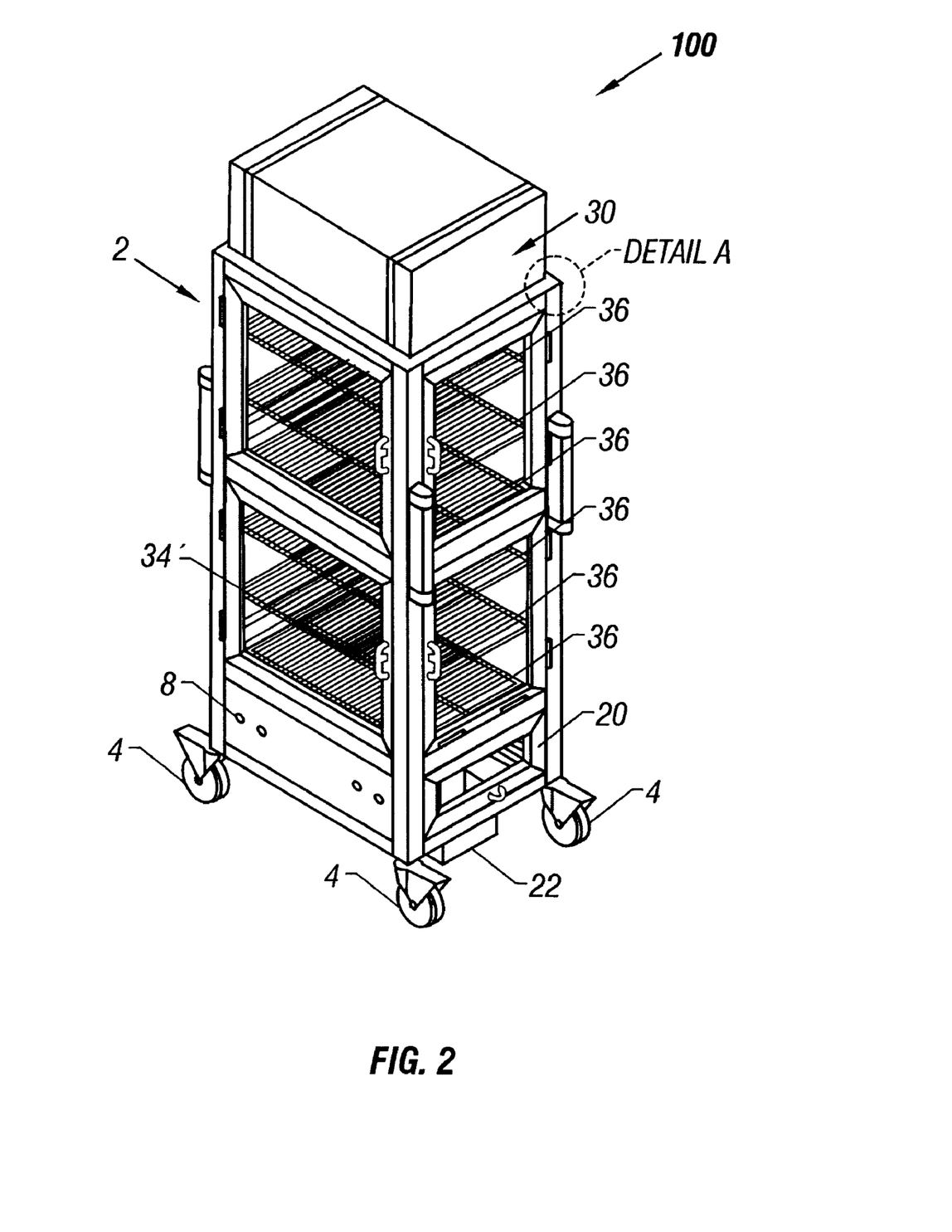
FIG. 2 shows a perspective view of the cart assembly of FIGS. 1A and 1B.

All of FFU 30, HCU 34, ionization unit 32, lighting unit 28, power supply 22, as well as any other electrical system on cart assembly 100 are controlled by control panel assembly 8. FIG. 2 shows a perspective view of cart assembly 100. As seen in the figure, there are several platform members, or shelves 36, which are mounted internally throughout cart assembly 100. As discussed above, these shelves can be specially configured to transport flat panel displays.

Figure 4A:
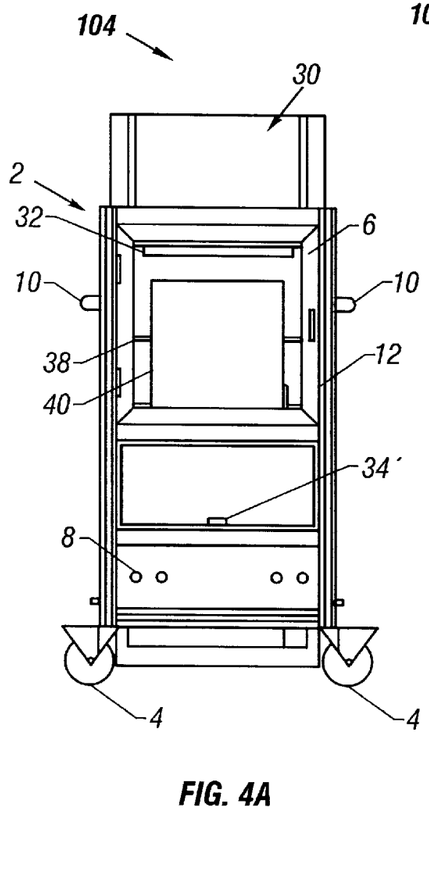
FIG. 4A shows a front view of an alternative embodiment of the cart assembly.
Figure 4B:
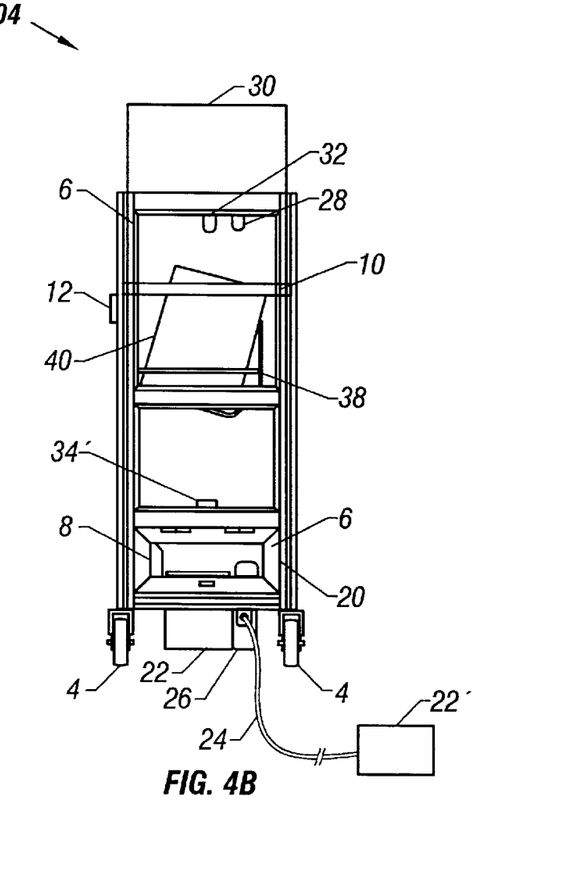
FIG. 4B shows a side view of the cart assembly of FIG. 4A.
Figure 5:
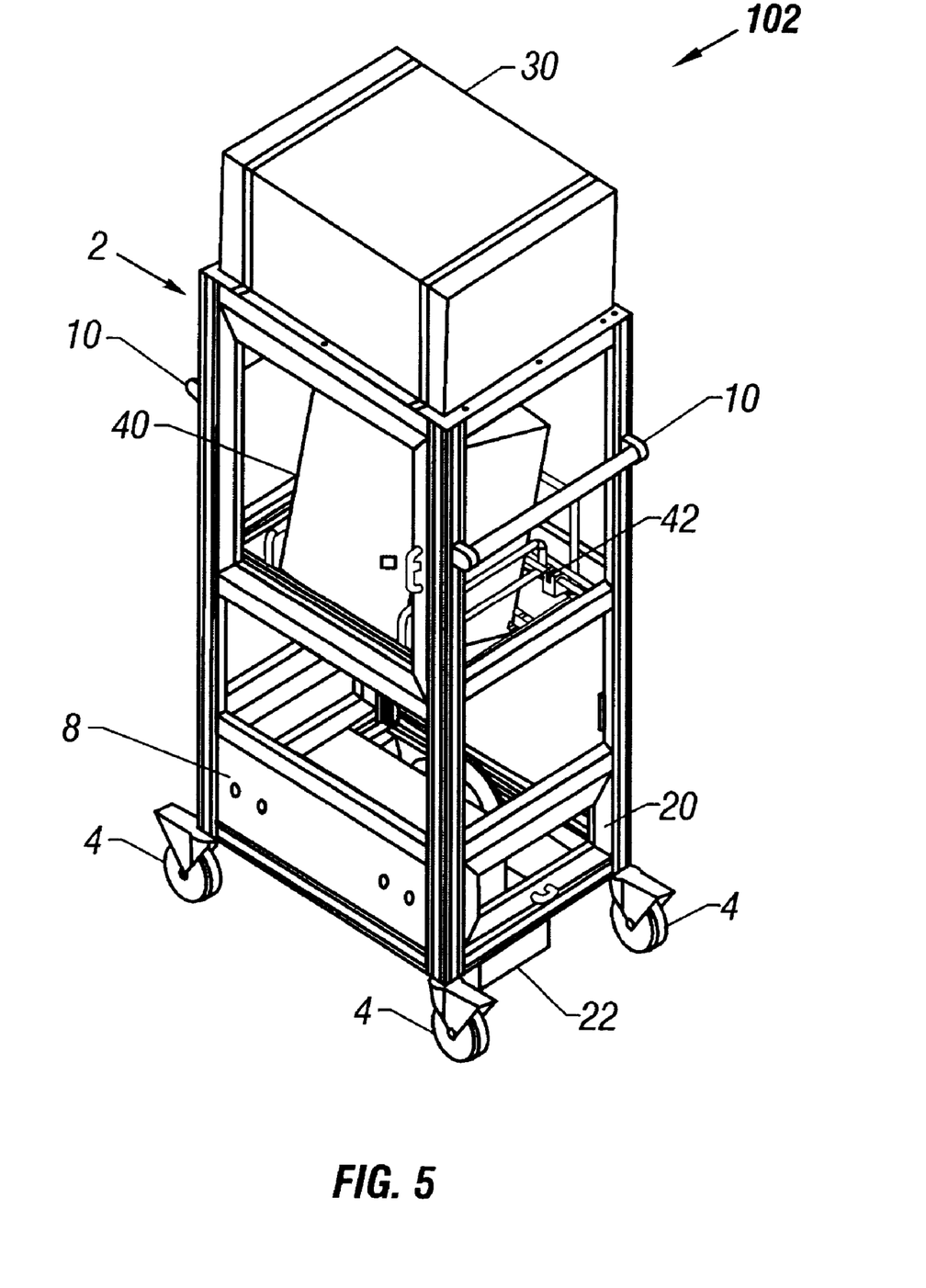
FIG. 5 shows a perspective view of the cart assembly of FIGS. 4A and 4B.

FIGS. 4A and 4B show an alternative embodiment. Cart assembly 104 is in most respects similar to cart assembly 100 (as shown in FIGS. 1A and 1B, respectively) in structure and function with similar elements identically labeled. Assembly 104 has a flat panel display (FPD) platform 38 which replaces platform members 36. FPD platform 38 is supported within assembly 104 by several FPD platform supports 42 (shown in FIG. 5) attached to frame assembly 2. Additionally, assembly 104 shows FPD platform 38 supporting a FPD cassette 40 disposed within frame assembly 2. FIG. 5 shows a perspective view of cart assembly 104 (similarly as in FIG. 2). As seen in the figure, FPD platform 38 is mounted internally within assembly 104 and supports FPD cassette 40. In transporting and temporarily storing FPD cassette 40, cart assembly 104 is able to maintain a temperature and humidity controlled environment utilizing FFU 30 and HCU 34 specifically for FPD cassette 40.

Figure 6:
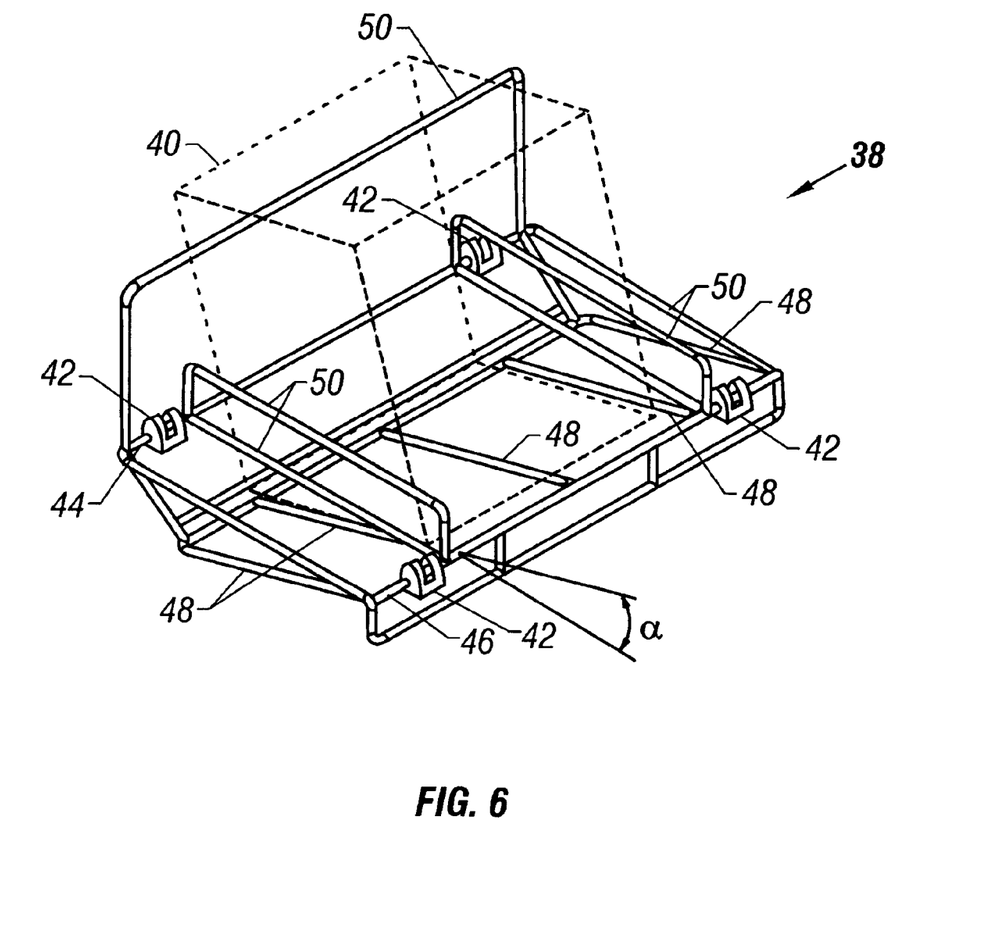
FIG. 6 shows a perspective view of the flat panel display platform with a cassette disposed on it.

The FPD platform 38, as seen in FIGS. 4A, 4B, and 5, is shown in a detail perspective view in FIG. 6. FIG. 6 shows platform 38 made of several beam elements in one embodiment; this is meant to be illustrative and is not meant to preclude any other possible embodiments. FPD platform 38 can be made of a metal, e.g., aluminum, which is strong enough to support a conventional FPD cassette 40. Platform 38 is attached to frame assembly 2 by several FPD platform supports 42 on rear mounting member 44 and forward mounting member 46. Mounting members 44, 46 are further supported by several cross members 48, which also comprise the resting surface for cassette 40. Cross members 48 are joined between members 44 and 46 such that they are sloped at an angle α, e.g., 15 degrees, relative to retaining members 50. So when cassette 40 is supported on FPD platform 38, cassette 40 tilts at an angle relative to frame assembly 2, as shown in FIG. 4, and ensures that cassette 40 remains securely seated within FPD platform 38. The tilting feature eases the loading and unloading of cassette 40 onto FPD platform 38 during transport. Additionally, tilting cassette 40 on FPD platform 38 aids in maintaining a unidirectional flow of gases within the cart enclosure; this in turn minimizes recirculation zones (eddies) of the gases and therefore results in a more efficient cooling and heating circulation.

Figure 7:
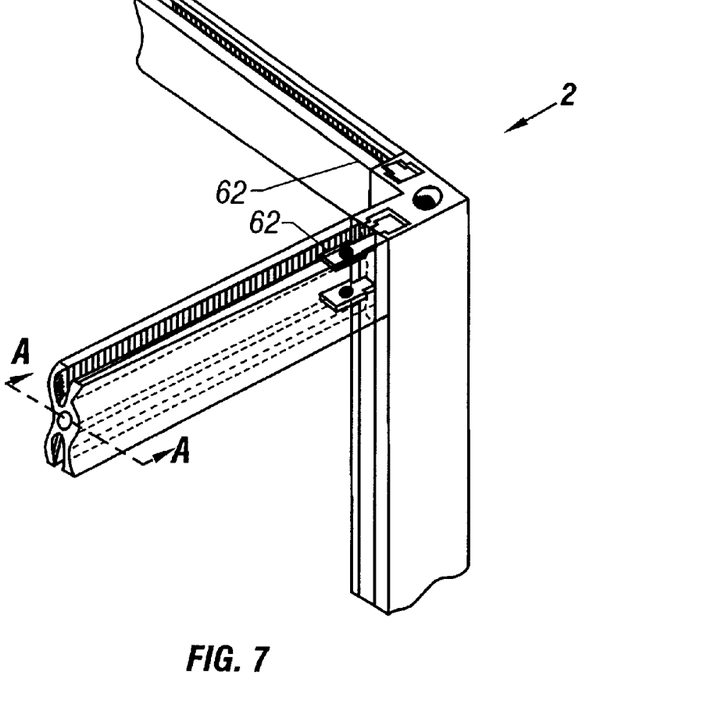
FIG. 7 shows a view of Detail A taken from FIG. 2.
Figure 8:
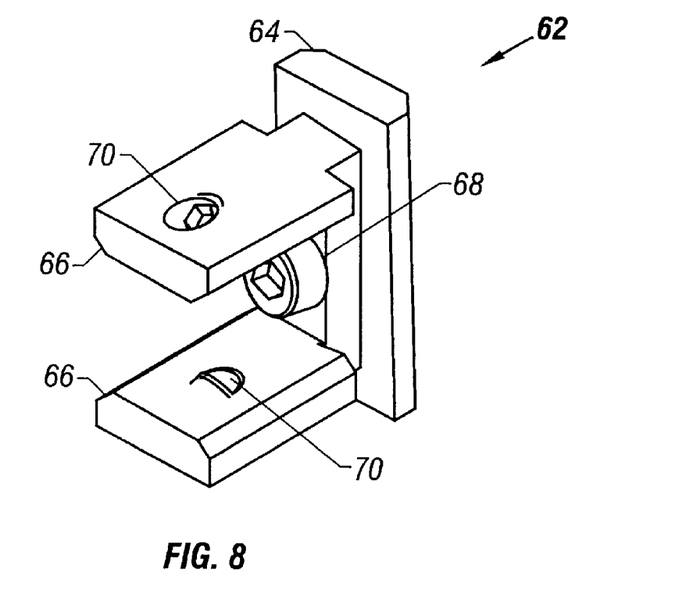
FIG. 8 shows a perspective view of the joint bracket assembly shown in FIG. 7.

In addition to the environmental controls, the cart assembly also has an element which improves the structural integrity of frame assembly 2. FIG. 7 shows Detail A which is taken from FIG. 2. The FIG. 7 shows the individual extruded elements forming a joint of frame assembly 2 and joint bracket 62 attaching the extruded elements together. Joint bracket 62 is a singular piece and is constructed from a high-strength material, e.g., aluminum or stainless steel. Bracket base 64 is formed such that it is able to slide into a railing and be retained in the extruded frame assembly 2. Extending from base 64 are two engaging arms 66 which are perpendicular from base 64; within arms 66 are engaging holes 70 which are formed at an angle of about 45 degrees relative to the perpendicular surfaces of engaging arms 66.

Figure 9A:
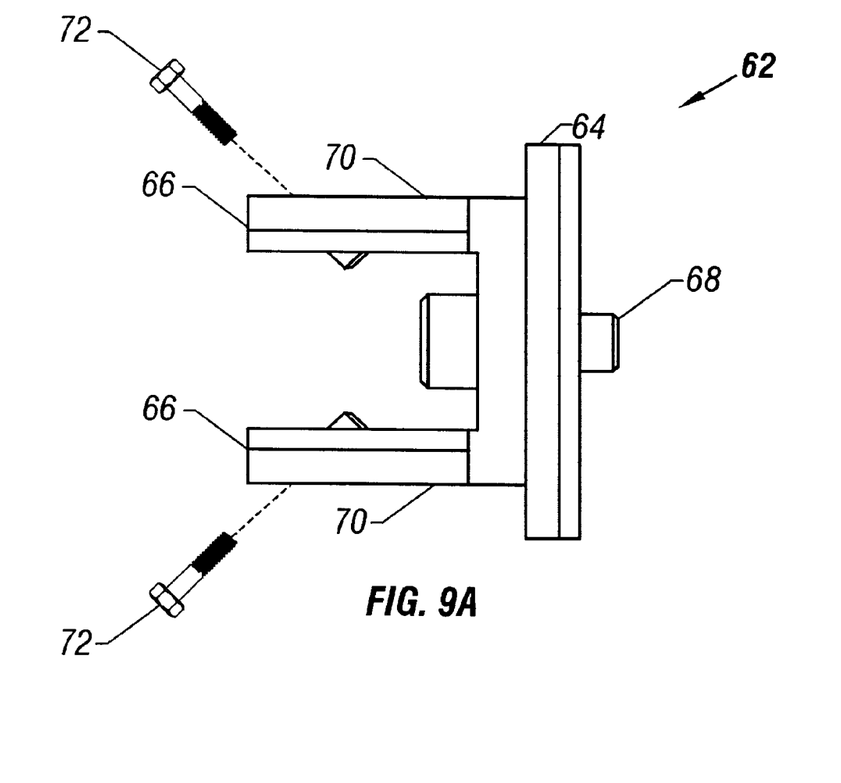
FIG. 9A shows a top view of the bracket assembly of FIG. 8.
Figure 9B:
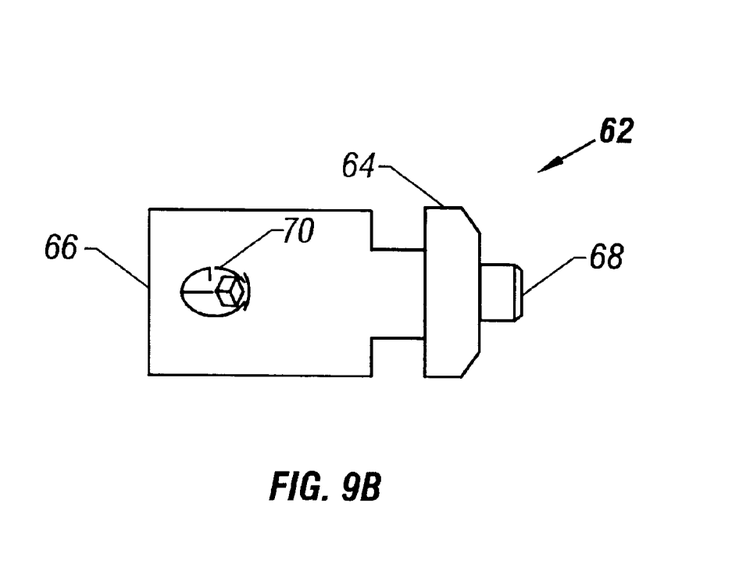
FIG. 9B shows a side view of the bracket assembly of FIG. 9A.
Figure 10:
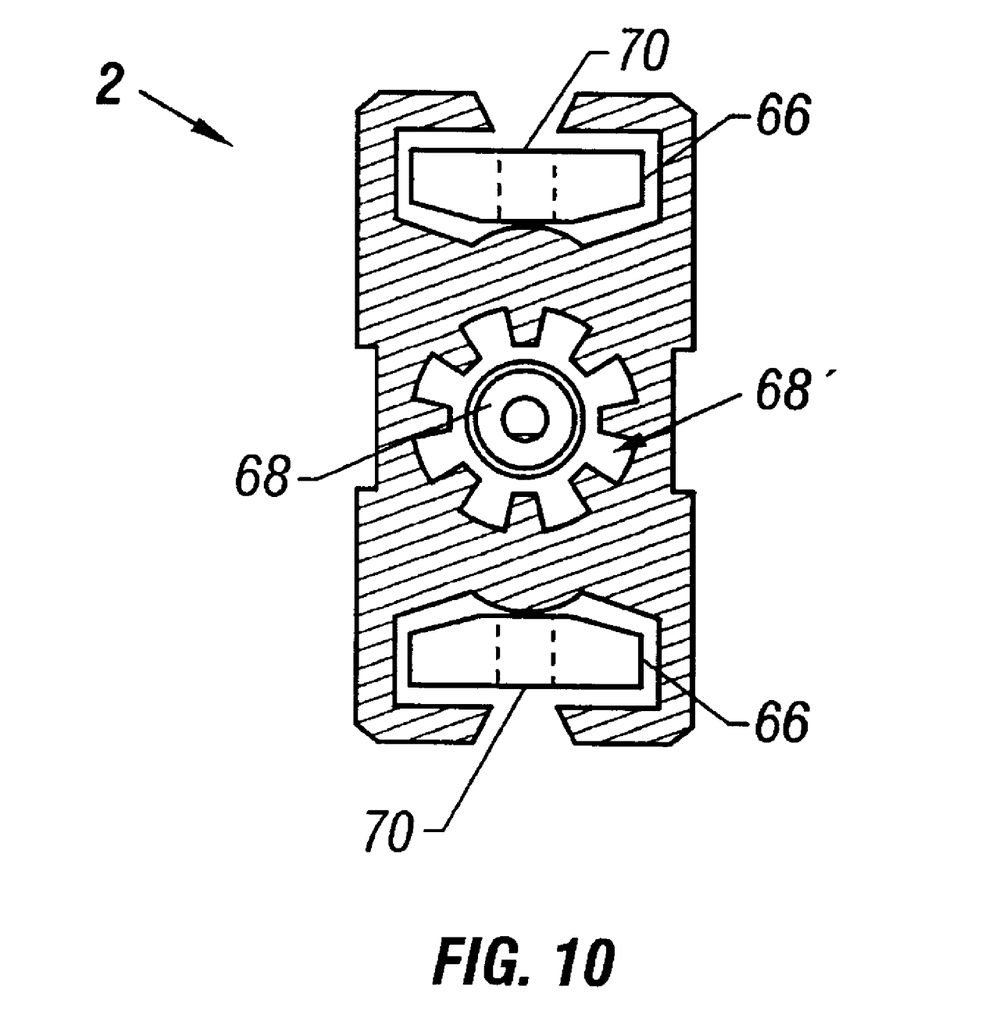
FIG. 10 shows a cross-sectional view of the joint bracket assembly within the cart assembly taken from FIG. 7.

FIG. 9A shows a top view of joint bracket 62 and the angled engaging holes 70. These holes 70 are angled such that they slope towards the center of base 64. Joint bracket 62 is held in place to frame assembly 2 by retaining bolt 68, which threads into frame assembly 2 or presses upon the inside wall of assembly 2 to wedge bracket 62 in the slot of the extrusion of assembly 2. During assembly of frame assembly 2, joint bracket 62 is first positioned within the railing of an extruded member. An adjoining extruded member is then positioned perpendicularly to fit over engaging arms 66; then engaging bolts 72 are used to attach the extruded members to joint bracket 62 through engaging holes 70. FIG. 9B shows a side view of joint bracket 62 and an engaging hole 70. Joint bracket 62 enables a singular bracket to be used in assembling joints for frame assembly 2, joint bracket 62 also reduces the number of fasteners required to assemble frame assembly 2. FIG. 10 shows a cross sectional view A—A taken from FIG. 7 of engaging arms 66 disposed within frame assembly 2. Engaging arms 66 are attached to frame assembly 2 by engaging bolts 72, which are fastened to frame assembly 2 through engaging holes 70 or by a jamfit as discussed above. Retaining bolt 68 lies within a cavity 68' in frame assembly 2.

Although the invention has been described with reference to particular embodiments, the description is only an example of the invention's application and should not be taken as a limitation. In particular, even though much of preceding discussion was aimed at carts environmentally controlled by thermoelectric heaters and fan and filter units, alternative embodiments of this invention include various other types of heating and cooling units, uses for carrying materials aside from flat panel displays, as well as different configurations for recirculating ducts within the cart assembly. Various other adaptations and combinations of features of the embodiments disclosed are within the scope of the invention as defined by the following claims.

We claim:

1. A transport cart for carrying environment-sensitive materials, comprising:

a frame, further comprising a plurality of inter-connected members;

a plurality of wheels supporting said frame;

a plurality of panels mounted on said frame such that said panels and said frame form an insulated enclosure;

a plurality of platform members attached to said frame and disposed within said enclosure;

a power supply unit disposed on said frame and external to said enclosure;

a lighting unit disposed within said enclosure and attached to said frame;

a gas disposed within said enclosure;

a filtering unit and a fan unit both disposed on said frame and in flow communication with said gas such that said fan unit compels said gas to flow within said enclosure;

an ionization device attached to said frame and disposed within said enclosure;

a plurality of heating and cooling units disposed on said frame and in flow communication with said gas within said enclosure;

a temperature and humidity sensor disposed within said enclosure and electrically attached in a closed feedback loop to said heating and cooling units; and a plurality of connectors for connecting a controller and said power supply to each of said lighting unit, said filtering unit, said fan unit, said ionization device, and said cooling and heating units.

2. The transport cart of claim 1, wherein said inter-connected members are comprised of an extruded metal.

3. The transport cart of claim 2, wherein said metal is anodized aluminum.

4. The transport cart of claim 1, wherein said panels are transparent.

5. The transport cart of claim 4, wherein said panels are comprised of polycarbonate.

6. The transport cart of claim 1, wherein said platform members are electrically isolated from said frame.

7. The transport cart of claim 1, wherein said platform members are removable from said frame.

8. The transport cart of claim 1, wherein said platform members are angularly disposed relative to said frame within said enclosure to support a flat panel display.

9. The transport cart of claim 1, wherein said power supply unit is further comprised of a chargeable battery.

10. The transport cart of claim 1, wherein said power supply unit is further comprised of an external power source.

11. The transport cart of claim 1, wherein each said heating and cooling unit is a thermoelectric heater.

12. The transport cart of claim 1, wherein said gas is selected from the group consisting of air and nitrogen.

13. The transport cart of claim 1, wherein said frame further comprises a plurality of brackets for attaching said inter-connected members together, wherein each said bracket is comprised of:

a base;

a first retaining member extending perpendicularly from said base;

a second retaining member extending perpendicularly from said base and substantially parallel to said first retaining member;

a first engaging hole angularly defined by said first retaining member such that said first engaging hole is angled towards a midpoint defined on said base and a first fastener angularly engages said first retaining member through said first engaging hole; and a second engaging hole angularly defined by said second retaining member such that said second engaging hole is angled towards said midpoint and a second fastener angularly engages said second retaining member through said second engaging hole.

14. A transport cart for carrying environment-sensitive materials, comprising:

a frame, further comprising a plurality of inter-connected members;

a plurality of wheels supporting said frame;

a plurality of panels mounted on said frame such that said panels and said frame form an insulated enclosure;

a plurality of platform members attached to said frame and disposed within said enclosure;

a power supply unit disposed on said frame and external to said enclosure;

a lighting unit disposed within said enclosure and attached to said frame;

an ionization device attached to said frame and disposed within said enclosure;

a gas disposed within said enclosure;

a plurality of heating and cooling units disposed on said frame and in flow communication with said gas;

a filtering unit and a fan unit both disposed on said frame and in flow communication with said enclosure whereby said fan unit compels said gas to flow in a repeating cycle first through said enclosure and then through said cooling and heating unit;

a temperature and humidity sensor disposed within said enclosure and electrically attached in a closed feedback loop to said heating and cooling units; and a plurality of connectors for connecting a controller and said power supply to each of said lighting unit, said filtering unit, said fan unit, said ionization device, and said cooling and heating unit.

15. The transport cart of claim 14, wherein said inter-connected members are comprised of an extruded metal.

16. The transport cart of claim 15, wherein said metal is anodized aluminum.

17. The transport cart of claim 14, where in said panels are transparent.

18. The transport cart of claim 17, wherein said panels are comprised of polycarbonate.

19. The transport cart of claim 14, wherein said platform members are electrically isolated from said frame.

20. The transport cart of claim 14, wherein said platform members are removable from said frame.

21. The transport cart of claim 14, wherein said platform members are angularly disposed relative to said frame within said enclosure to support a flat panel display.

22. The transport cart of claim 14, wherein said power supply unit is further comprised of a chargeable battery.

23. The transport cart of claim 14, wherein said power supply unit is further comprised of an external power source.

24. The transport cart of claim 14, wherein each said heating and cooling unit is a thermoelectric heater.

25. The transport cart of claim 14, further comprising a chemical filtration unit attached on said frame and disposed within said enclosure.

26. The transport cart of claim 14, wherein said gas is selected from the group consisting of air and nitrogen.

27. The transport cart of claim 14, wherein said frame further comprises a plurality of brackets for attaching said inter-connected members together, wherein each said bracket is comprised of:

a base;

a first retaining member extending perpendicularly from said base;

a second retaining member extending perpendicularly from said base and substantially parallel to said first retaining member;

a first engaging hole angularly defined by said first retaining member such that said first engaging hole is angled towards a midpoint defined on said base and a first fastener angularly engages said first retaining member through said first engaging hole; and a second engaging hole angularly defined by said second retaining member such that said second engaging hole is angled towards said midpoint and a second fastener angularly engages said second retaining member through said second engaging hole.

* * * * *